United States Patent
Yang et al.

(10) Patent No.: US 11,068,635 B2
(45) Date of Patent: Jul. 20, 2021

(54) METHOD OF DESIGNING A MASK AND METHOD OF MANUFACTURING A SEMICONDUCTOR DEVICE USING THE SAME

(71) Applicant: Samsung Electronics Co., Ltd., Suwon-si (KR)

(72) Inventors: Ki-Ho Yang, Hwaseong-si (KR); Jun-Young Jang, Suwon-si (KR); Chang-Hwan Kim, Hwaseong-si (KR); Sung-Soo Suh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/117,086

(22) Filed: Aug. 30, 2018

(65) Prior Publication Data
US 2019/0163858 A1    May 30, 2019

(30) Foreign Application Priority Data

Nov. 27, 2017    (KR) .......................... 10-2017-0159664

(51) Int. Cl.
| G06F 30/392 | (2020.01) |
| G03F 1/36 | (2012.01) |
| H01L 21/8234 | (2006.01) |
| H01L 27/02 | (2006.01) |

(52) U.S. Cl.
CPC .............. *G06F 30/392* (2020.01); *G03F 1/36* (2013.01); *H01L 21/823437* (2013.01); *H01L 21/823481* (2013.01); *H01L 27/0207* (2013.01)

(58) Field of Classification Search
CPC ............................. G03F 7/70425; G03F 1/36
See application file for complete search history.

(56) References Cited

U.S. PATENT DOCUMENTS

| 7,432,143 | B2 | 10/2008 | Cho et al. | |
| 7,673,270 | B1* | 3/2010 | Wang | G03F 1/36 716/51 |
| 8,279,703 | B2 | 10/2012 | Yang et al. | |
| 8,697,527 | B2 | 4/2014 | Kim | |
| 8,901,646 | B2 | 12/2014 | Jeon et al. | |
| 9,035,394 | B2 | 5/2015 | Han et al. | |
| 9,158,352 | B2 | 10/2015 | Crisp et al. | |
| 2003/0085428 | A1* | 5/2003 | Nelson | H01L 23/4824 257/368 |
| 2008/0032204 | A1* | 2/2008 | Herold | G03F 1/36 430/5 |
| 2008/0066041 | A1* | 3/2008 | Kahng | G06F 17/5072 257/798 |
| 2009/0278569 | A1* | 11/2009 | Taoka | E21B 47/135 326/101 |

(Continued)

FOREIGN PATENT DOCUMENTS

| KR | 10-2007-0078567 A | 8/2007 |
| KR | 10-2009-0044481 A | 5/2009 |

*Primary Examiner* — Brian Turner
(74) *Attorney, Agent, or Firm* — Harness, Dickey & Pierce, P.L.C.

(57) ABSTRACT

In a method of designing a mask, a first mask including an active region, a gate structure, and a gate tap partially overlapping the active region and the gate structure is designed. The first mask is changed so that a portion of the gate tap is extended. An OPC is performed on the changed first mask to design a second mask.

8 Claims, 15 Drawing Sheets

(56) References Cited

U.S. PATENT DOCUMENTS

| | | | |
|---|---|---|---|
| 2012/0001271 A1* | 1/2012 | Chae | H01L 29/4238 257/401 |
| 2014/0123082 A1* | 5/2014 | Akhssay | G06F 17/5081 716/52 |
| 2015/0187655 A1* | 7/2015 | Parikh | H01L 22/34 438/18 |
| 2015/0263039 A1* | 9/2015 | Singh | H01L 27/11807 257/206 |
| 2015/0287604 A1* | 10/2015 | Stephens | H01L 21/76895 438/587 |

* cited by examiner

METHOD OF DESIGNING A MASK AND METHOD OF MANUFACTURING A SEMICONDUCTOR DEVICE USING THE SAME

CROSS-REFERENCE TO RELATED APPLICATION

This application claims priority under 35 USC § 119 to Korean Patent Application No. 10-2017-0159664, filed on Nov. 27, 2017 in the Korean Intellectual Property Office (KIPO), the contents of which are herein incorporated by reference in their entirety.

BACKGROUND

1. Field

Example embodiments relate to methods of designing a mask and methods of manufacturing a semiconductor device using the same. More particularly, example embodiments relate to methods of designing a mask of a semiconductor device having a gate tap and methods of manufacturing a semiconductor device using the same.

2. Description of the Related Art

In order to reduce an HEIP phenomenon in a PMOS transistor, a tap may be formed at a portion of a gate disposed at a boundary area between the gate and an active region. Thus, a width of the gate may vary around the portion of the tap, however, the width change of the gate may not be easily realized according as the device has been miniaturized.

SUMMARY

Example embodiments provide an improved method of designing a mask.

Example embodiments provide a method of manufacturing a semiconductor device using the improved method of designing the mask.

According to example embodiments, there is provided a method of designing a mask. In the method, a first mask including an active region, a gate structure, and a gate tap partially overlapping the active region and the gate structure may be designed. The first mask may be changed so that a portion of the gate tap is extended. An OPC may be performed on the changed first mask to design a second mask.

According to example embodiments, there is provided a method of designing a mask. In the method, a mask including an active region, gate structures each extending in a first direction, and gate taps including at least one gate tap partially overlapping the active region and one of the gate structures may be designed. The mask may be changed so that a portion of the at least one gate tap at an outside of the active region is extended in the first direction until an edge of the at least one gate tap contacts another one of the gate structures or another one of the gate taps. An OPC may be performed on the changed mask.

According to example embodiments, there is provided a method of designing a mask. In the method, an isolation pattern may be formed on a substrate to define an active region. A first gate structure extending in a first direction substantially parallel to an upper surface of the substrate may be formed on the active region and the isolation pattern, and a second gate structure extending in a second direction substantially parallel to the upper surface of the substrate and crossing the first direction and contacting the first gate structure may be formed on the isolation pattern. A first portion of the first gate structure adjacent the second gate structure on the isolation pattern may have a width in the second direction greater than a width in the second direction of a second portion of the first gate structure on a central portion of the active region.

In a method of designing a mask, when an OPC for offsetting the optical proximity effect generated during a photo process in which a photoresist pattern is formed using the designed mask is performed, a portion of a gate structure having a relatively small width may be replaced with a portion of a gate tap having a relatively large width so as not to have a width below a given standard size. Thus, during the MRC, no errors may occur due to the small portion of the gate structure, and when a gate structure is actually formed on a substrate using the mask, process margin may be assured.

DESCRIPTION OF EXAMPLE EMBODIMENTS

Example embodiments will be more clearly understood from the following detailed description taken in conjunction with the accompanying drawings.

Figure 1:
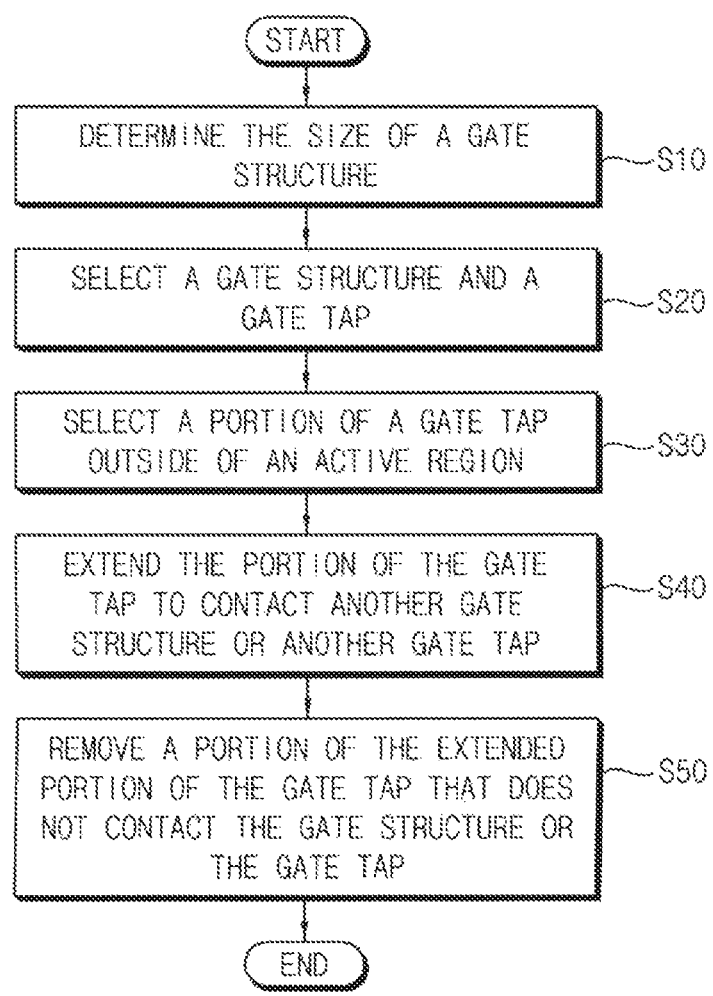
FIG. 1 is a flowchart illustrating a portion of a method of designing a mask in accordance with example embodiments.

FIG. 1 is a flowchart illustrating a portion of a method of designing a mask in accordance with example embodiments.

Referring to FIG. 1, after designing a mask including active regions, gate structures, and gate taps, in a first operation S10, a size of a gate structure including a gate tap of which a layout has to be changed or amended may be determined.

Designing the mask may be designing a "layout" of each element included in the mask, however, in order to avoid complexity, it may be described as "designing an element," hereinafter.

In example embodiments, the gate structures may include a first gate structure extending in a first direction to partially overlap at least one of the active regions and a second gate structure extending in a second direction substantially perpendicular to the first direction to overlap no active regions.

Each of the gate taps may partially overlap a boundary area between the active region and the first gate structure. In example embodiments, a width of each gate tap in the second direction may be greater than that of the first gate structure in the second direction.

In example embodiments, the size of the gate structure including the gate tap of which the layout has to be changed or amended may be determined by a width of the gate structure in a direction substantially perpendicular to an extension direction of the gate structure. For example, the size of the first gate structure may be determined as a value equal to or less than a given width of the first gate structure in the second direction.

In a second operation S20, ones of the gate structures having the determined size and ones of the gate taps overlapping the ones of the gate structures may be selected.

For example, ones of the first gate structures having a width in the second direction equal to or less than the given width, and ones of the gate taps overlapping the ones of the first gate structures may be selected.

In a third operation S30, a portion of each of the selected gate taps in an outside of the active region may be selected.

For example, when each gate tap overlapping the first gate structure has a rectangular shape, an edge of the rectangular shape in an outside of the active region and a portion adjacent thereto in the first direction may be selected as the portion of the gate tap that has to be changed or amended.

In a fourth operation S40, the selected portion of the gate tap may be extended in a direction so that the edge of the gate tap may contact another gate structure or another gate tap.

For example, the edge of the selected portion of the gate tap overlapping the first gate structure may be extended in the first direction to contact a sidewall of the second gate structure.

Alternatively, an edge of a selected portion of a first gate tap overlapping the first gate structure may be extended in the first direction to contact an edge of a second gate tap overlapping the first gate structure and being spaced apart from the first gate tap in the first direction.

In a fifth operation S50, if the extended portion of the gate tap does not contact another gate structure or another gate tap within a given length, the extended portion may be removed so that the selected gate tap may have the original shape.

For example, if the extended portion of the first gate tap overlapping the first gate structure does not contact a sidewall of the second gate structure or an edge of the second gate tap within a given length, the extended portion of the first gate tap may be removed so that the first gate tap may have the original shape.

By the above operations, the gate tap at the boundary area between the active region and the gate structure that may have a width greater than that of the gate structure may be extended to overlap a portion of the gate structure contacting another gate structure or another gate tap in an outside of the active region.

Thus, when an optical proximity correction (OPC) for offsetting the optical proximity effect generated during a photo process in which a photoresist pattern is formed using the designed mask is performed, a portion of a gate structure having a relatively small width may be replaced with a portion of a gate tap having a relatively large width so as not to have a width below a given standard size. Thus, during the mask manufacturing rule checking (MRC), no errors may occur due to the small portion of the gate structure, and when a gate structure is actually formed on a substrate using the mask, process margin may be assured.

FIGS. 2 to 5 are plan views illustrating a method of designing a mask in accordance with example embodiments. This method may include operations substantially the same as or similar to those of the method of designing the mask illustrated with reference to FIG. 1.

Figure 2:
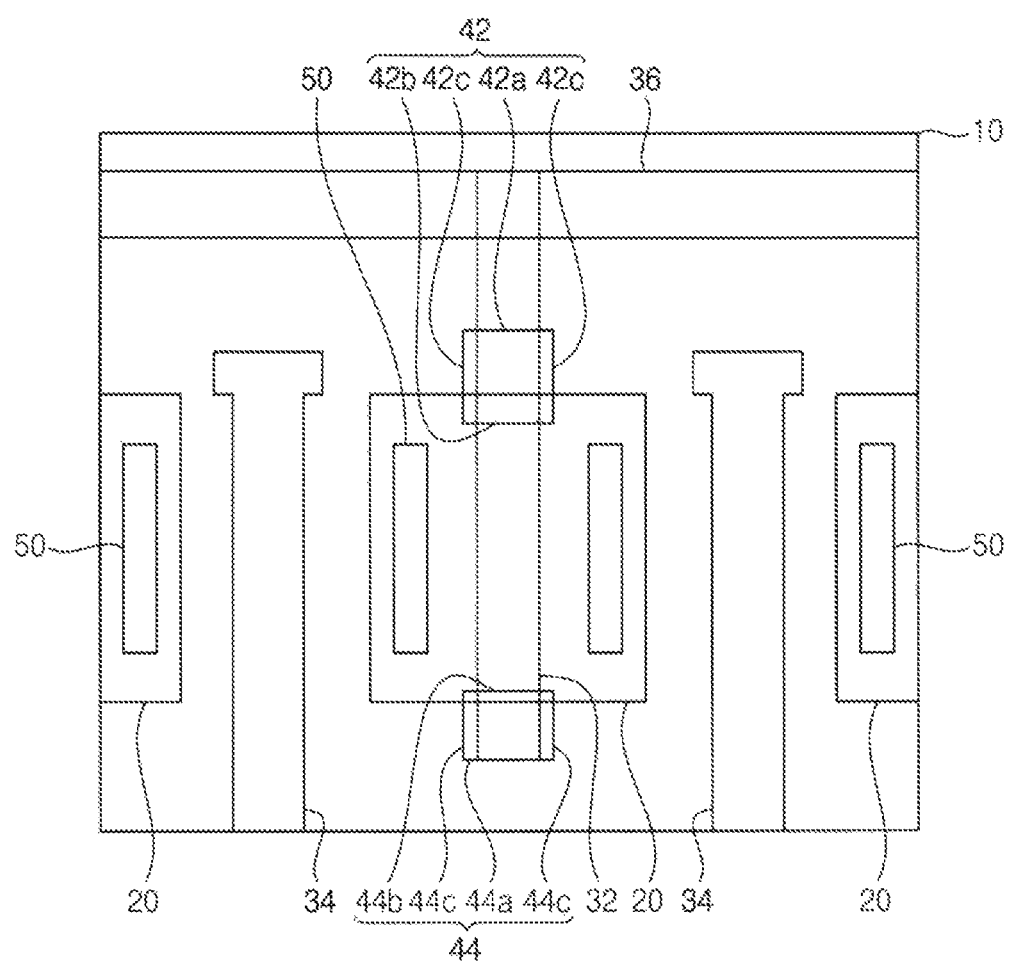
FIGS. 2 to 5 are plan views illustrating a method of designing a mask in accordance with example embodiments.

Referring to FIG. 2, a first mask 10 including an active region 20, first to third gate structures 32, 34 and 36, first and second gate taps 42 and 44, and/or a contact plug 50 may be designed.

A plurality of active regions 20 may be spaced apart from each other in each of first and second directions. In example embodiments, each of the active regions 20 may have a rectangular shape, however, the inventive concepts may not be limited thereto. An area outside of the active region 20 may be referred to as a field region.

The first gate structure 32 may extend in the first direction, and may partially overlap at least one of the active regions 20. The second gate structure 34 may extend in the first direction, and may overlap the field region. The third gate structure 36 may extend in the second direction, and a sidewall of the third gate structure 36 may contact or partially overlap an end of the first gate structure 32.

Each of the first and second gate taps 42 and 44 may be disposed at and overlap a boundary area between the first gate structure 32 and the active region 20. Each of the first and second gate taps 42 and 44 may have a width in the second direction greater than that of the first gate structure 32.

The first gate tap 42 may overlap a portion of the first gate structure 32 adjacent one edge of the active region 20, which may face a sidewall of the third gate structure 36 and extend in the second direction, and the second gate tap 44 may overlap a portion of the first gate structure 32 adjacent another edge of the active region 20, which may be opposite to the one edge of the active region 20 and extend in the second direction.

In example embodiments, each of the first and second gate taps 42 and 44 may have a rectangular shape. Thus, the first gate tap 42 may include a first edge 42a facing the sidewall of the third gate structure 36 and extending in the second direction in the field region, a second edge 42b opposite the first edge 42a extending in the second direction in the active region 20, and third edges 42c opposite to each other extending in the first direction in the active region 20 and the field region. Additionally, the second gate tap 44 may include a fourth edge 44a extending in the second direction in the field region, a fifth edge 44b opposite the fourth edge 44a extending in the second direction in the active region 20, and sixth edges 44c opposite to each other extending in the first direction in the active region 20 and the field region.

The contact plug 50 may extend in the first direction in the active region 20, and may be disposed at each of opposite sides of the first gate structure 32 in the second direction.

Figure 3:
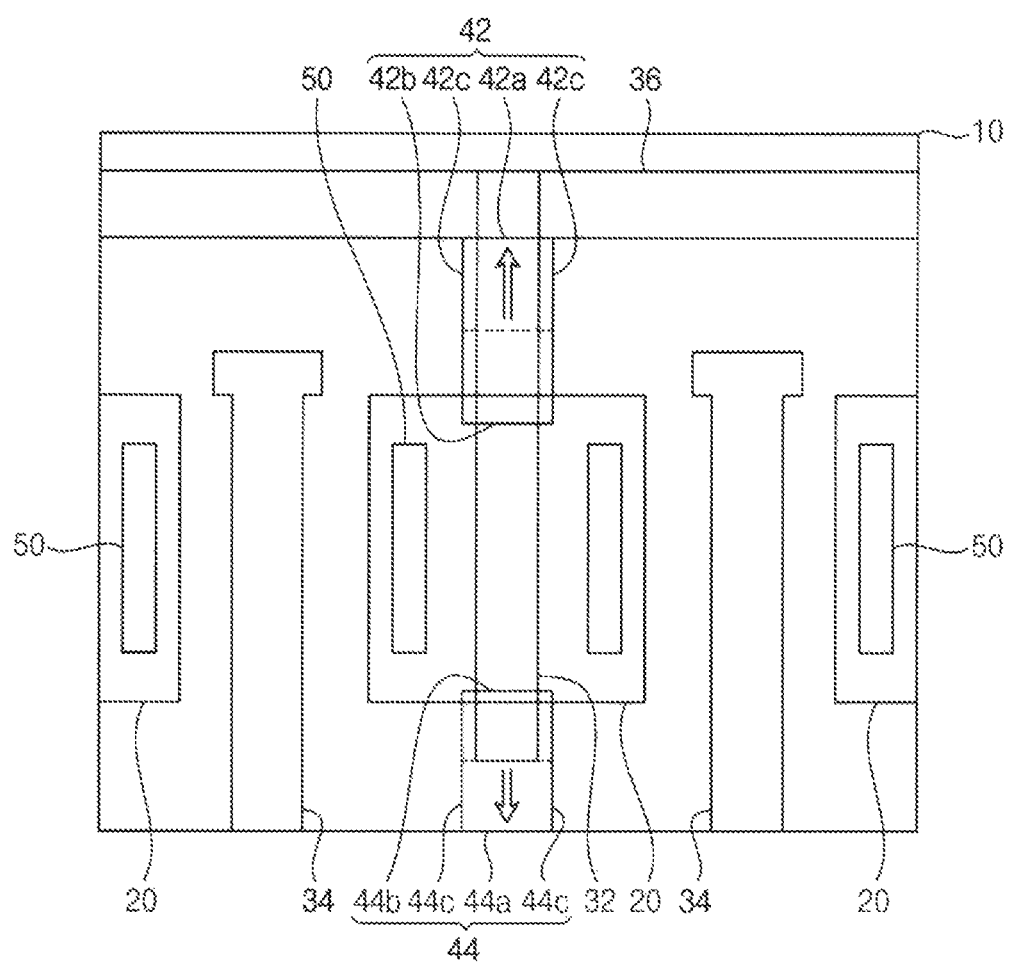

Referring to FIG. 3, operations substantially the same as or similar to the first to fourth operations S10, S20, S30 and S40 illustrated with reference to FIG. 1 may be performed.

That is, after determining a size of a gate structure including a gate tap of which a layout has to be changed or amended, gate structures having the determined size and gate taps overlapping the gate structures may be selected. A portion of each of the selected gate taps in an outside of the active region, e.g., in the field region may be selected, and the selected portion of the gate tap may be extended in a direction so that an edge of the gate tap may contact another gate structure or another gate tap.

Thus, for example, after selecting the first gate structure 32 and the first and second gate taps 42 and 44 overlapping the first gate structure 32, a portion of each of the first and second gate taps 42 and 44 in the field region may be extended in the first direction.

In example embodiments, the portion of the first gate tap 42 in the field region may be extended in the first direction until the first edge 42a of the first gate tap 42 may contact a sidewall of the third gate structure 36. Thus, the first edge 42a may move in the first direction to the sidewall of the third gate structure 36, and each of the third edges 42c may be extended in the first direction so as to have an increased length.

Additionally, the portion of the second gate tap 44 in the field region may be extended in the first direction to a given length. Thus, the fourth edge 44a may move in the first direction by the given length, and each of the sixth edges 44c may be extended in the first direction so as to have an increased length.

Figure 4:
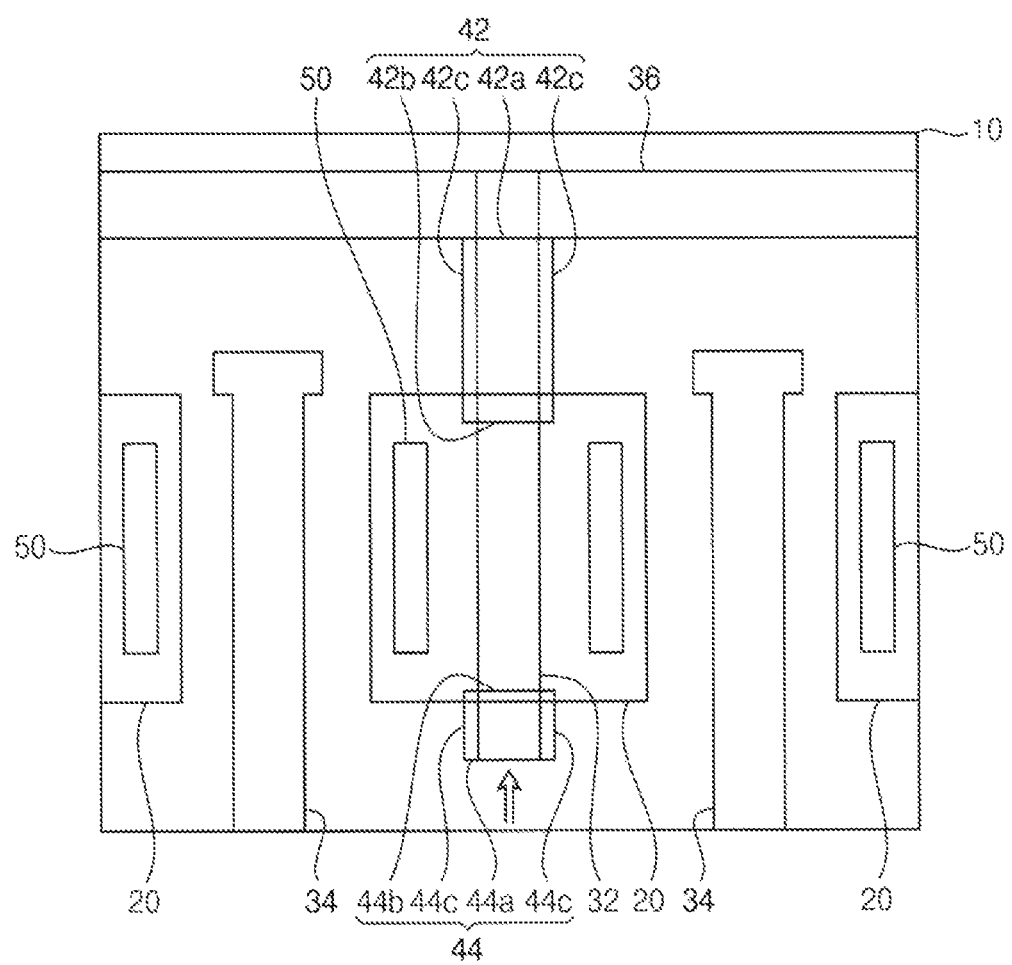
Figure 4:

Referring to FIG. 4, an operation substantially the same as or similar to the fifth operation S50 may be performed.

That is, if the extended portion of the gate tap does not contact another gate structure or another gate tap within a given length, the extended portion may be removed so that the selected gate tap may have the original shape.

For example, the second gate tap 44 does not contact another gate structure or another gate tap within a given length, and thus the extended portion thereof may be removed to have the original shape and size. That is, the fourth edge 44a may move in the first direction to the original position, and the increased lengths of the sixth edges 44c may be reduced to the original lengths.

Figure 5:
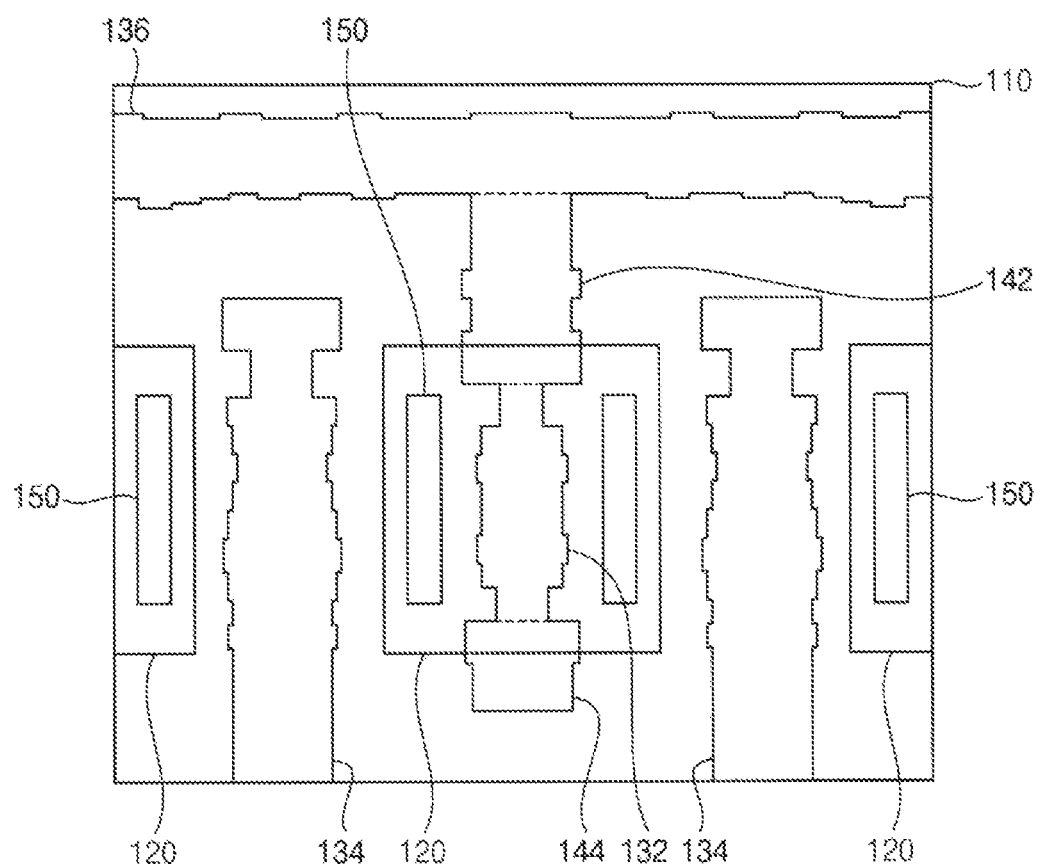

Referring to FIG. 5, an OPC may be performed on the first mask 10 so that a second mask 110 having changed or amended layouts of elements may be designed.

Thus, the second mask 110 may include an active region 120, first to third gate structures 132, 134 and 136, first and second gate taps 142 and 144, and a contact plug 150 of which layouts are changed or amended from those in the first mask 10.

In example embodiments, a width in the second direction of the extended portion of the first gate tap 142 adjacent the third gate structure 136 may be equal to or greater than a width in the second direction of the first gate structure 132. Thus, during the MRC, no errors may occur due to the small width of the first gate structure 132.

Figure 6:
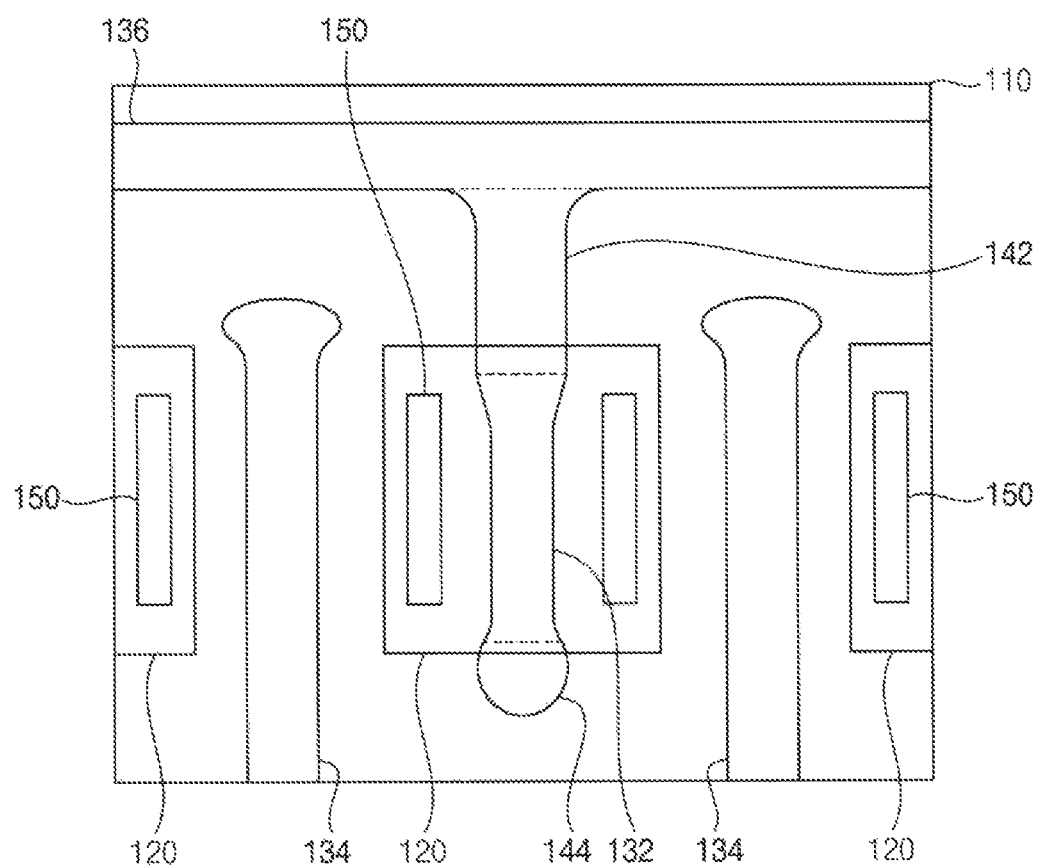
FIG. 6 is a plan view illustrating layouts of elements when a photoresist pattern is formed using the second mask 110 designed in FIG. 5.
Figure 6:

FIG. 6 is a plan view illustrating layouts of elements when a photoresist pattern is formed using the second mask 110 designed in FIG. 5.

Referring to FIG. 6, the width in the second direction of the extended portion of the first gate tap 142 adjacent the third gate structure 136 may be equal to or greater than the width in the second direction of the first gate structure 132, which may gradually increase as the extended portion of the first gate tap 142 approaches the third gate structure 136.

Accordingly, when an actual patterning process for forming gate structures and gate taps is performed, sufficient process margin may be assured.

Figure 7:
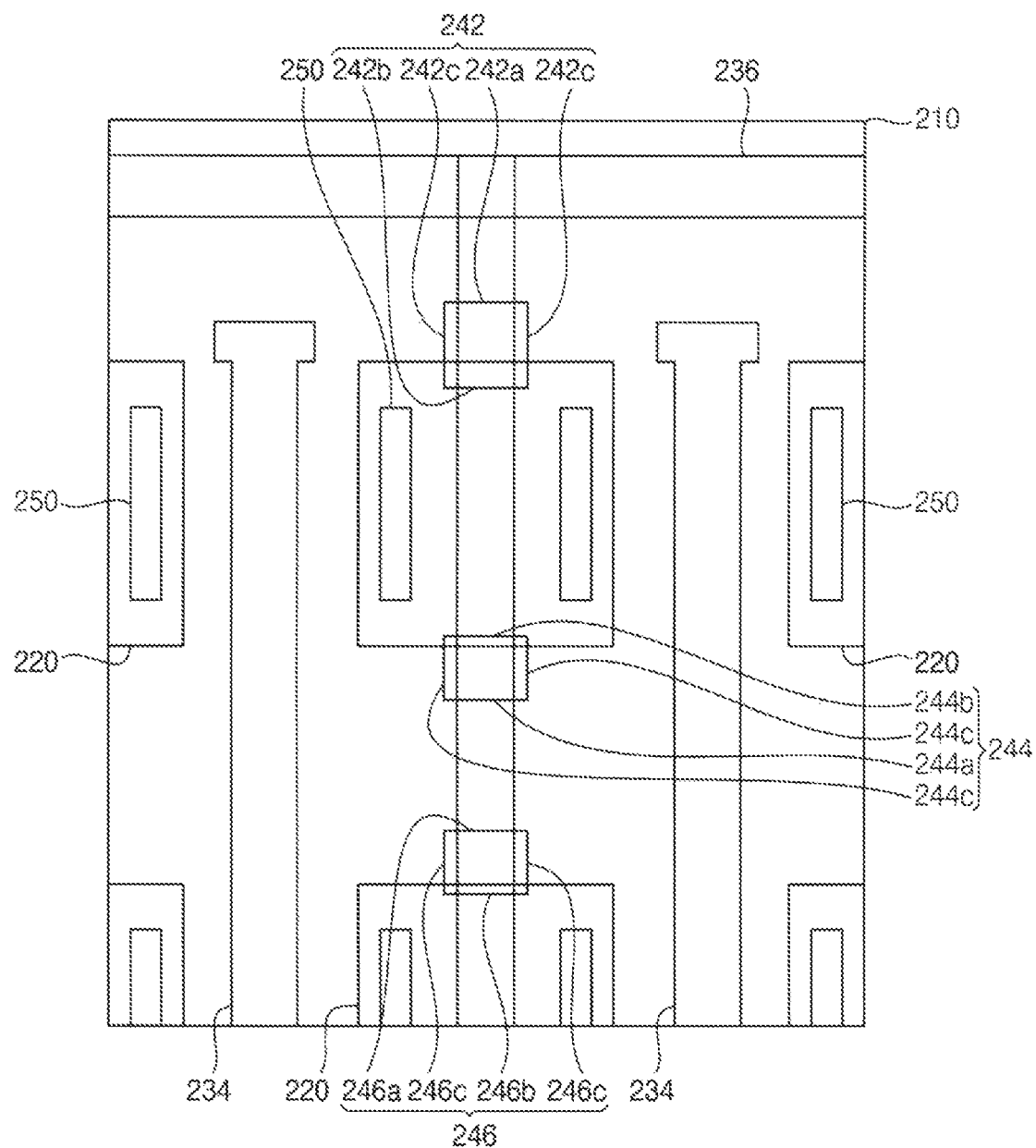
FIGS. 7 to 9 are plan views illustrating a method of designing a mask in accordance with example embodiments.
Figure 8:
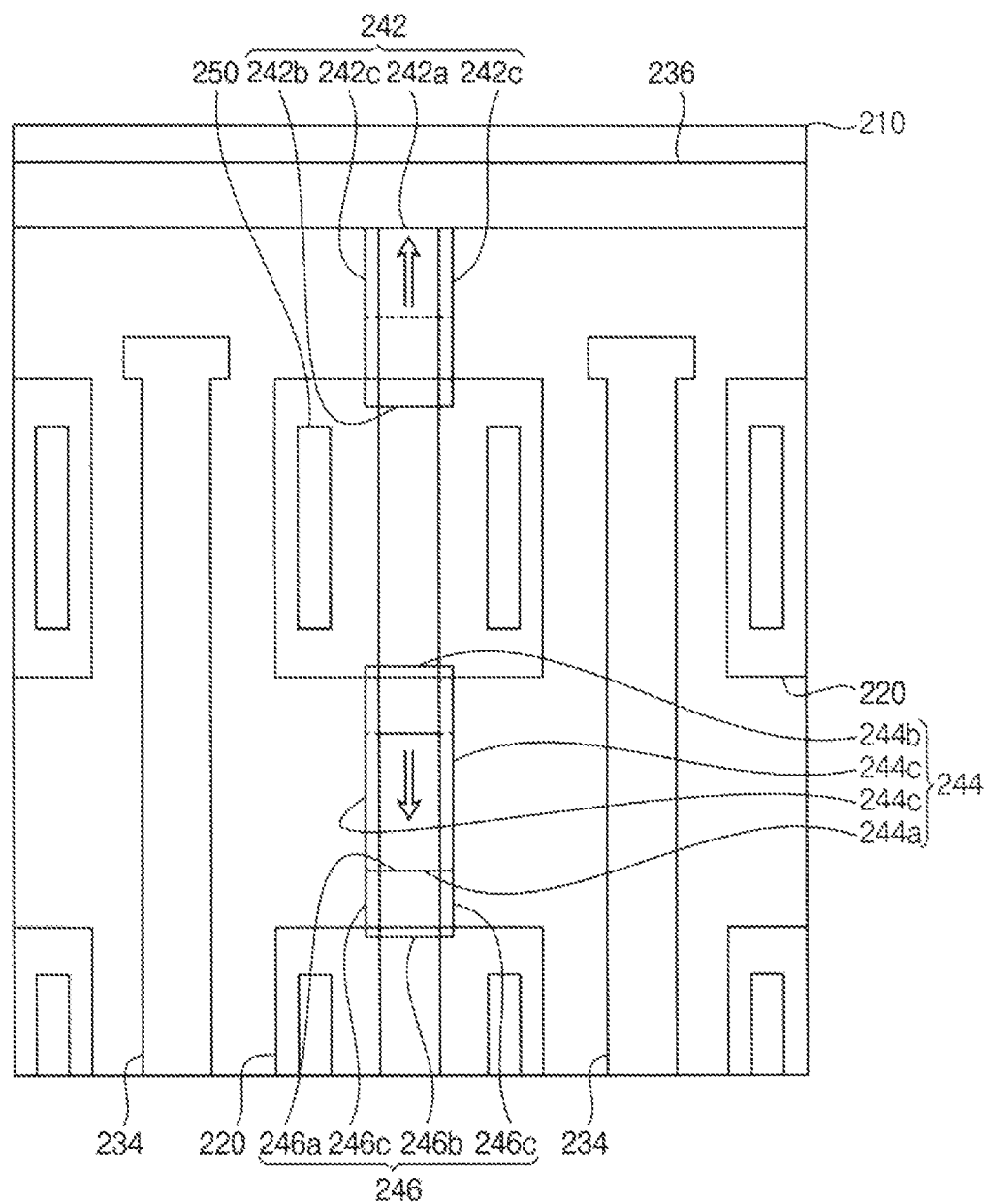
Figure 9:
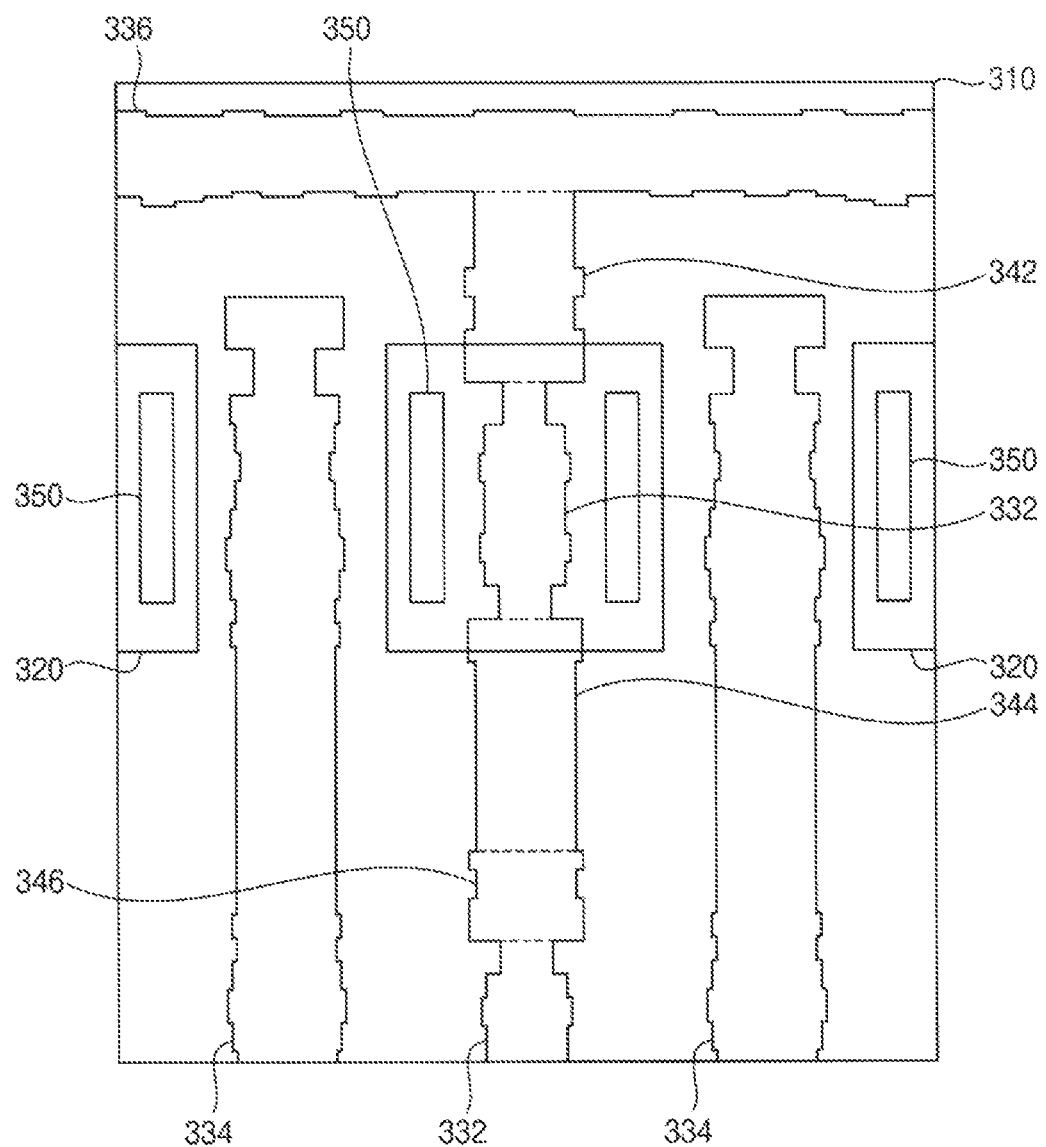

FIGS. 7 to 9 are plan views illustrating a method of designing a mask in accordance with example embodiments. This method may include processes substantially the same as or similar to those illustrated with reference to FIGS. 2 to 6, and the layouts of elements may be substantially the same as those illustrated with reference to FIGS. 2 to 6.

Referring to FIG. 7, a third mask 210 including an active region 220, fourth to sixth gate structures 232, 234 and 236, third to fifth gate taps 242, 244 and 246, and a contact plug 250 may be designed.

The fourth gate structure 232 may extend in the first direction, and may partially overlap the active regions 220 spaced apart from each other in the first direction. The fifth gate structure 234 may extend in the first direction, and may overlap the field region. The sixth gate structure 236 may extend in the second direction, and a sidewall of the sixth gate structure 236 may contact or partially overlap an end of the fourth gate structure 232.

Each of the third to fifth gate taps 242, 244 and 246 may be disposed at and overlap a boundary area between the fourth gate structure 232 and the active region 220.

The third gate tap 242 may overlap a portion of the fourth gate structure 232 adjacent one edge of one of the active regions 220, which may face a sidewall of the sixth gate structure 236 and extend in the second direction, the fourth gate tap 244 may overlap a portion of the fourth gate structure 232 adjacent another edge of the one of the active regions 220, which may be opposite to the one edge of the one of the active regions 220 and extend in the second direction, and the fifth gate tap 246 may overlap a portion of the fourth gate structure 232 adjacent one edge of another one of the active regions 220, which may face the fourth gate tap 244 and extend in the second direction.

In example embodiments, each of the third to fifth gate taps 242, 244 and 246 may have a rectangular shape. Thus, the third gate tap 242 may include a seventh edge 242a facing the sidewall of the sixth gate structure 236 and extending in the second direction in the field region, an eighth edge 242b opposite the seventh edge 242a extending in the second direction in the active region 220, and ninth edges 242c opposite to each other extending in the first direction in the active region 220 and the field region.

Additionally, the fourth gate tap 244 may include a tenth edge 244a extending in the second direction in the field region, an eleventh edge 244b opposite the tenth edge 244a extending in the second direction in the active region 220, and twelfth edges 244c opposite to each other extending in the first direction in the active region 220 and the field region.

The fifth gate tap 242 may include a thirteenth edge 246a facing the tenth edge 244a and extending in the second direction in the field region, a fourteenth edge 246b opposite the thirteenth edge 246a extending in the second direction in the active region 220, and fifteenth edges 246c opposite to each other extending in the first direction in the active region 220 and the field region.

Referring to FIG. 8, processes substantially the same as or similar to those illustrated with reference to FIG. 3 may be performed.

In example embodiments, a portion of the third gate tap 242 in the field region may be extended in the first direction until the seventh edge 242a of the third gate tap 242 may contact a sidewall of the sixth gate structure 236. Thus, the seventh edge 242a may move in the first direction to the sidewall of the sixth gate structure 236, and each of the ninth edges 242c may be extended in the first direction so as to have an increased length.

Additionally, a portion of the fourth gate tap 244 in the field region may be extended in the first direction until the tenth edge 244a of the fourth gate tap 244 may contact the thirteenth edge 246a of the fifth gate tap 246. Thus, the tenth edge 244a may move in the first direction to the thirteenth edge 246a of the fifth gate tap 246, and each of the twelfth edges 244c may be extended in the first direction to have an increased length.

The fifth gate tap 246 may be extended in the first direction, so that the thirteenth edge 246a may move to the tenth edge 244a of the fourth gate tap 244, and each of the fifteenth edges 246c may be extended in the first direction to have an increased length, which may be the same result as the extension of the fourth gate tap 244.

Processes substantially the same as or similar to those illustrated with reference to FIG. 5 may be performed, however, the third to fifth gate taps 242, 244 and 246 may contact the sixth gate structure 236, the fifth gate tap 246 and the fourth gate tap 244, respectively, and thus no portions may be removed.

Referring to FIG. 9, processes substantially the same as or similar to those illustrated with reference to FIG. 5 may be performed.

Thus, an OPC may be performed on the third mask 210 so that a fourth mask 310 having changed or amended layouts of elements may be designed.

Thus, the fourth mask 310 may include an active region 320, fourth to sixth gate structures 332, 334 and 336, third to fifth gate taps 342, 344 and 346, and a contact plug 350 of which layouts are changed or amended from those in the third mask 210.

In example embodiments, a width in the second direction of the extended portion of the third gate tap 342 adjacent the sixth gate structure 336 may be equal to or greater than a width in the second direction of the fourth gate structure 332. Additionally, a width in the second direction of the extended portion of the fourth gate tap 344 adjacent the fifth gate tap 346 may be also equal to or greater than a width in the second direction of the fourth gate structure 332. Thus, during the MRC, no errors may occur due to the small width of the fourth gate structure 332.

Figure 10:
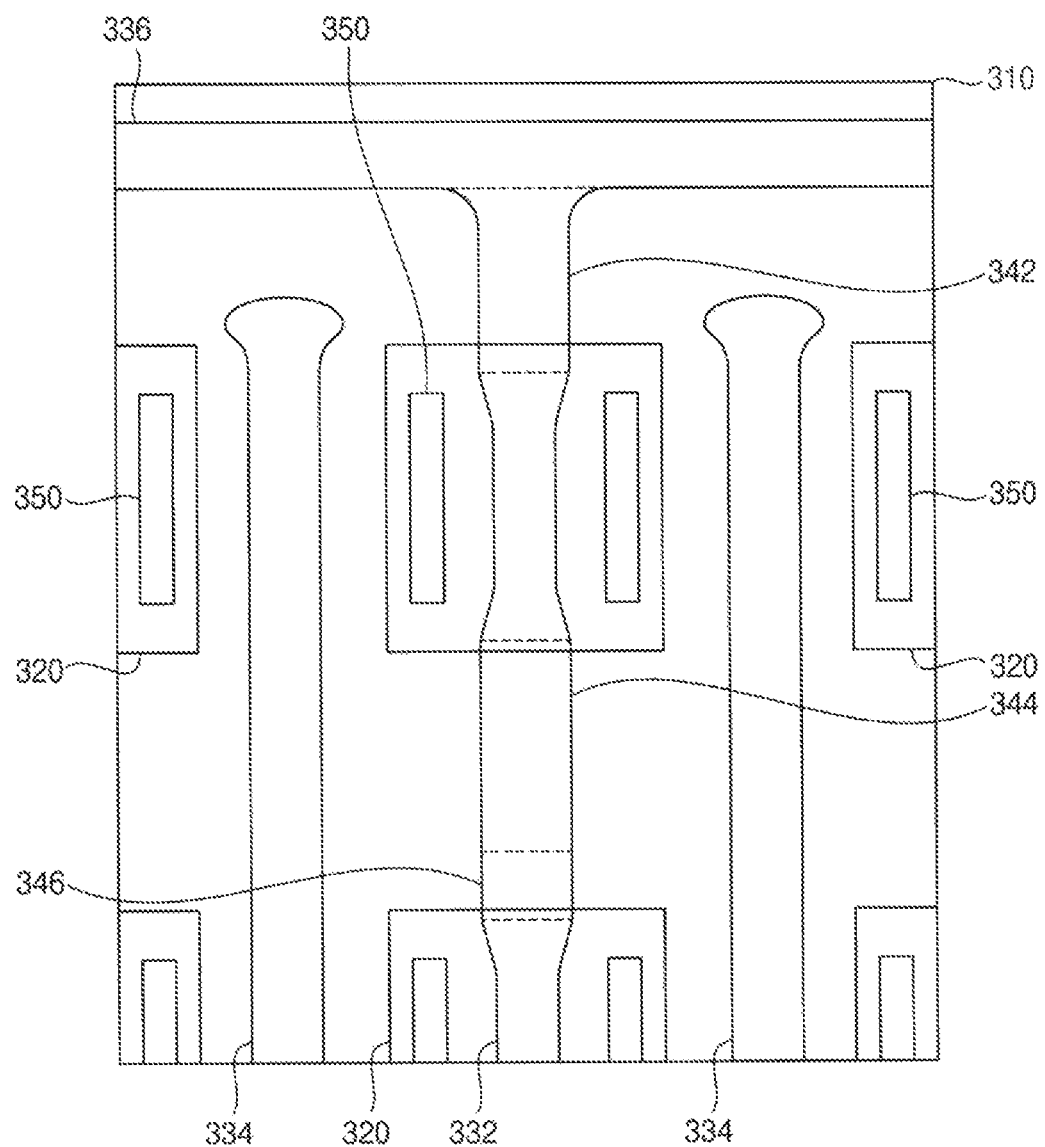
FIG. 10 is a plan view illustrating layouts of elements when a photoresist pattern is formed using the fourth mask 310 designed in FIG. 9.

FIG. 10 is a plan view illustrating layouts of elements when a photoresist pattern is formed using the fourth mask 310 designed in FIG. 9.

Referring to FIG. 10, the width in the second direction of the extended portion of the third gate tap 342 adjacent the sixth gate structure 336 may be equal to or greater than the width in the second direction of the fourth gate structure 332, which may gradually increase as the extended portion of the third gate tap 342 approaches the sixth gate structure 336. Additionally, the width in the second direction of the extended portion of the fourth gate tap 344 adjacent the fifth gate tap 346 may be also equal to or greater than the width in the second direction of the fourth gate structure 332.

Accordingly, when an actual patterning process for forming gate structures and gate taps is performed, sufficient process margin may be assured.

Figure 11:
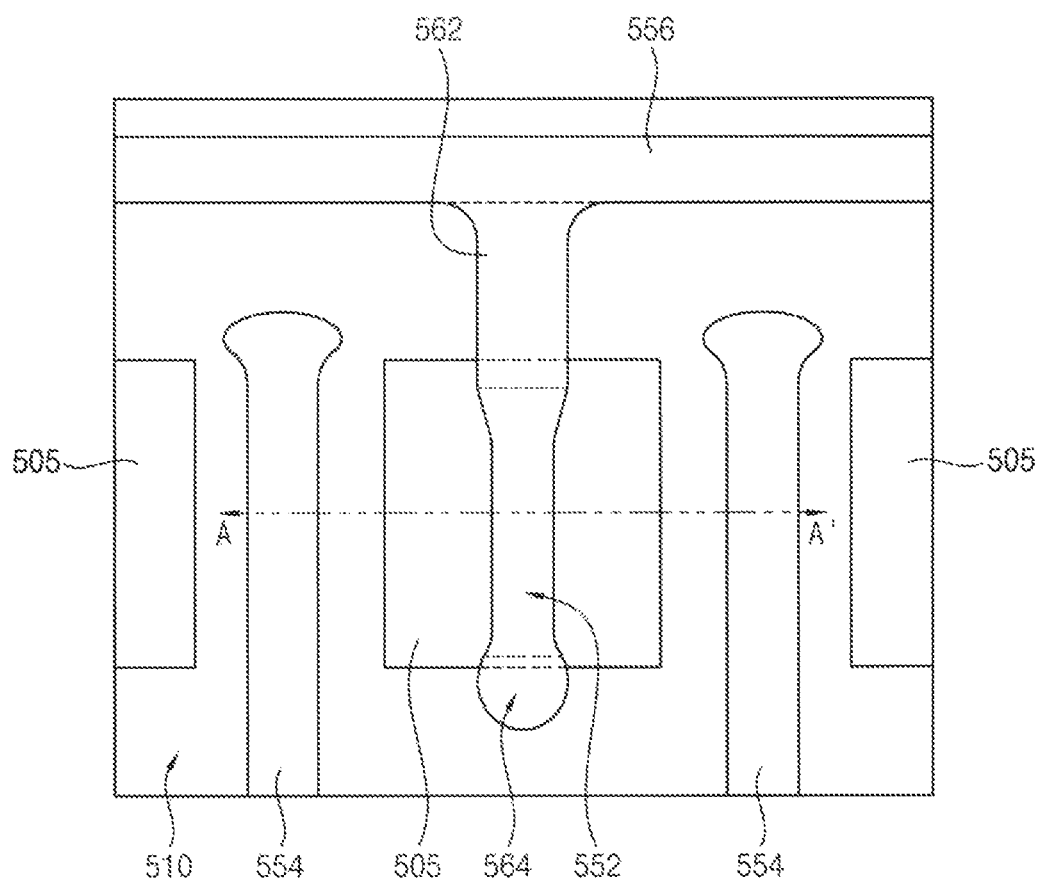
FIGS. 11 to 14 are plan views and cross-sectional views illustrating a method of manufacturing a semiconductor device in accordance with example embodiments.
Figure 12:
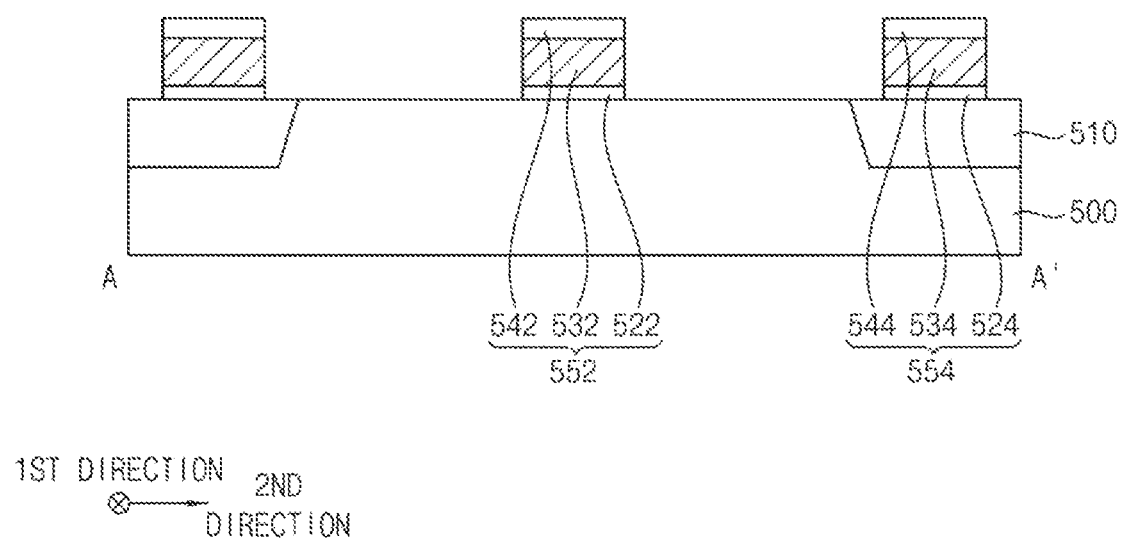
Figure 13:
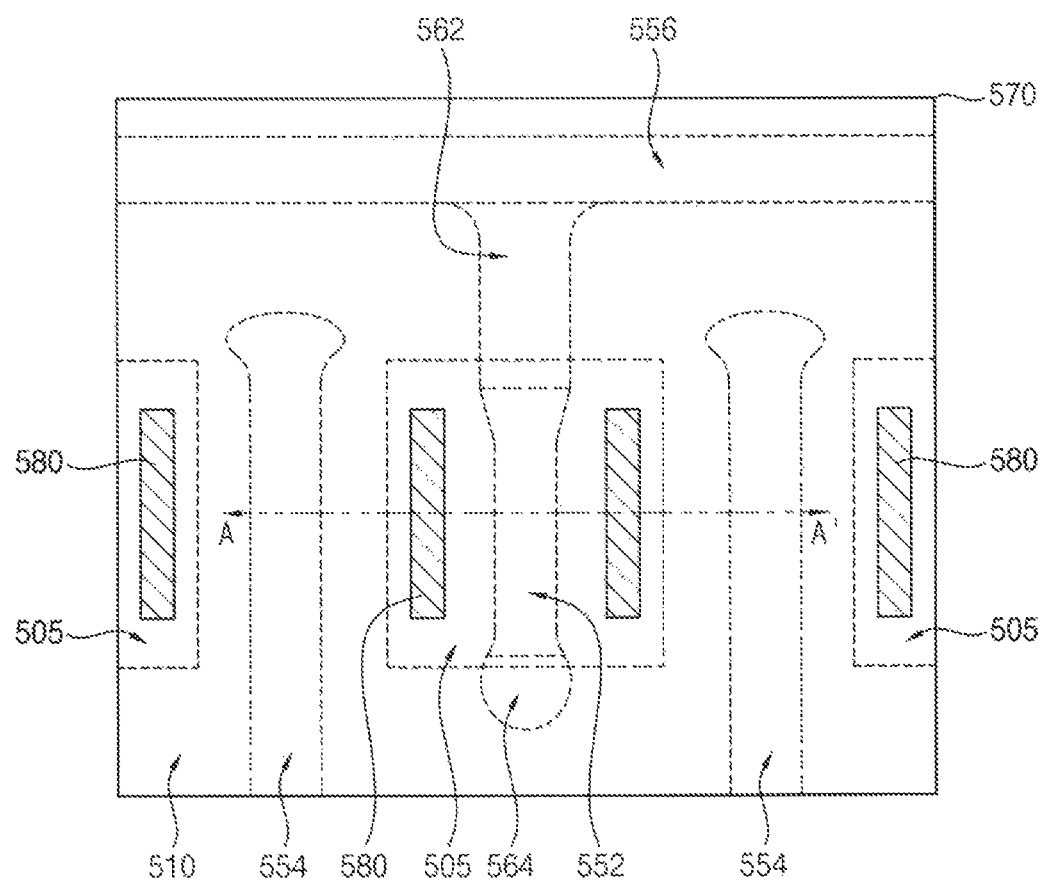
Figure 14:
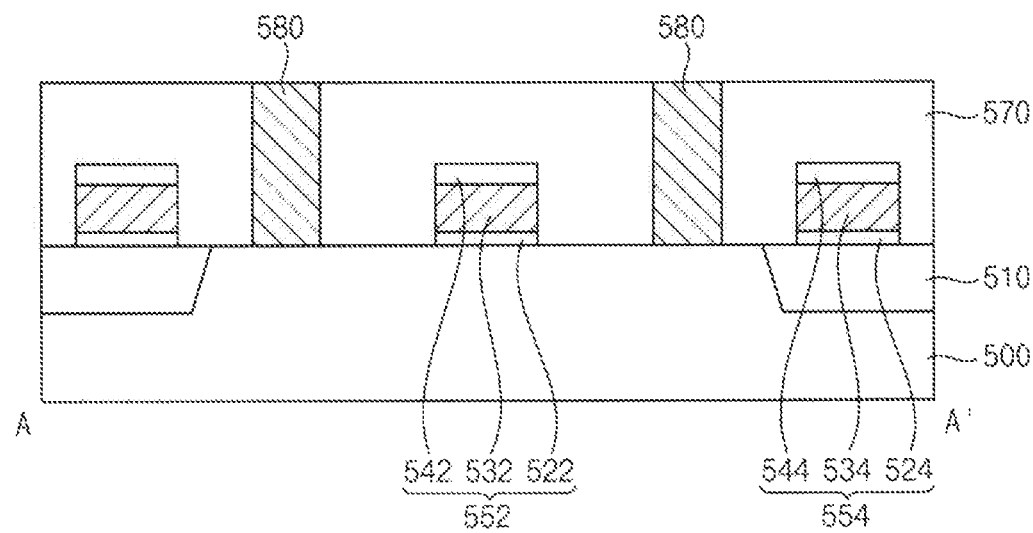

FIGS. 11 to 14 are plan views and cross-sectional views illustrating a method of manufacturing a semiconductor device in accordance with example embodiments. Particularly, FIGS. 11 and 13 are plan views, and FIGS. 12 and 14 are cross-sectional views taken along lines A-A' of FIGS. 11 and 13, respectively.

This method may be performed using the second mask 110 designed by processes illustrated with reference to FIGS. 2 to 5. That is, a photoresist pattern may be formed on a substrate or an etching object layer using the second mask 110, and the substrate or the etching object layer may be patterned using the photoresist as an etching mask to manufacture the semiconductor device.

Referring to FIGS. 11 and 12, an isolation pattern 510 may be formed on a substrate 500 to define an active region 505, and first to third gate structures 552, 554 and 556 and first and second gate taps 562 and 564 may be formed on the active region 505 and the isolation pattern 510.

The substrate 500 may include a semiconductor material, e.g., silicon, germanium, silicon-germanium, etc., or III-V semiconductor compounds, e.g., GaP, GaAs, GaSb, etc. In some example embodiments, the substrate 100 may be a silicon-on-insulator (SOI) substrate, or a germanium-on-insulator (GOI) substrate.

The isolation pattern 510 may be formed by etching the substrate 500 using a first photoresist pattern (not shown) as an etching mask to form a trench, forming an isolation layer on the substrate 500 to fill the trench, and planarizing the isolation layer until an upper surface of the substrate 500 may be exposed.

The first photoresist pattern may be formed by forming a first photoresist layer (not shown) on the substrate 500, and patterning the first photoresist layer by a photo process using the second mask 110 including the layout of the active region 120.

The isolation layer may include an oxide, e.g., silicon oxide, and the planarization process may be performed by, e.g., a chemical mechanical polishing (CMP) process and/or an etch back process.

A plurality of active regions 505 may be formed in each of first and second directions that may be substantially parallel to the upper surface of the substrate 500 and cross each other. In example embodiments, the first and second directions may be substantially perpendicular to each other.

The first to third gate structures 552, 554 and 556 and the first and second gate taps 562 and 564 may be formed by sequentially stacking a gate insulation layer, a gate electrode layer, and a gate mask layer on the active region 505 of the substrate 500 and the isolation pattern 510, etching the gate mask layer using a second photoresist pattern (not shown) as an etching mask to form a gate mask 542, and etching the gate electrode layer and the gate insulation layer using the gate mask 542 as an etching mask.

The second photoresist pattern may be formed by forming a second photoresist layer (not shown) on the gate mask layer, and patterning the second photoresist layer by a photo process using the second mask 110 including the layouts of the first to third gate structures 132, 134 and 136 and the first and second gate taps 142 and 144.

The gate insulation layer may include an oxide, e.g., silicon oxide, the gate electrode layer may include, e.g., a metal, a metal nitride, a metal silicide, or doped polysilicon, and the gate mask layer may include a nitride, e.g., silicon nitride.

In example embodiments, the first gate structure 552 may extend in the first direction, and may partially overlap at least one of the active regions 505. The second gate structure 554 may extend in the first direction, and may overlap the field region. The third gate structure 556 may extend in the second direction.

The first gate structure 552 may include a first gate insulation pattern 522, a first gate electrode 532 and a first gate mask 542 sequentially stacked, the second gate structure 554 may include a second gate insulation pattern 524, a second gate electrode 534 and a second gate mask 544 sequentially stacked, and the third gate structure 556 may include a third gate insulation pattern (not shown), a third gate electrode (not shown) and a third gate mask (not shown) sequentially stacked.

In example embodiments, the first and second gate taps 562 and 564 may be formed at a boundary area between the active region 505 and the isolation pattern 510. The first and second gate taps 562 and 564 may be formed by the same patterning process as that of the first to third gate structures 552, 554 and 556, and thus may have the same stacked structure.

That is, each of the first and second gate taps 562 and 564 may indicate a portion of the first gate structure 552. In example embodiments, a portion of the first gate structure 552 extending in the first direction on one edge of the active region 505 and the isolation pattern 510 to contact a sidewall of the third gate structure 556 may be referred to as the first gate tap 562, and a portion of the first gate structure 552 extending in the first direction on another edge of the active region 505 and the isolation pattern 510 may be referred to as the second gate tap 564.

In example embodiments, a width in the second direction of each of the first and second gate taps 562 and 564 may be greater than a width in the second direction of the first gate structure 552. Thus, the first and second gate taps 562 and 564, particularly, a portion of the first gate tap 562 adjacent the sidewall of the third gate structure 556 may have a relatively large width, and thus process margin of the patterning process for forming the portion of the first gate tap 562 may be assured.

Impurities may be implanted into an upper portion of the active region 505 adjacent the first gate structure 552 to form an impurity region (not shown). In example embodiments, the impurity region may include p-type impurities, e.g., boron, aluminum, etc., and thus the first gate structure 552 and the impurity region may form a PMOS transistor.

In example embodiments, a hot electron induced punch-through (HEIP) phenomenon in a PMOS transistor may be reduced by the first and second gate taps 562 and 564 having a relatively widths when compared to other portions of the first gate structure 552.

Even if the first gate tap 562 is extended in the first direction to contact the third gate structure 556 so that the first gate structure 552 may have an increased width in the second direction, the extended portion of the first gate tap 562 may be not on the active region 505 but on the isolation pattern 510, and thus the characteristics of the PMOS transistor may not be changed.

Referring to FIGS. 13 and 14, an insulating interlayer 570 may be formed on the active region 505 of the substrate 500 and the isolation pattern 510 to cover the first to third gate structures 552, 554 and 556 and the first and second gate taps 562 and 564, and a contact plug 580 may be formed through the insulating interlayer 570 to contact the impurity region at the upper portion of the active region 505.

The insulating interlayer 570 may include an oxide, e.g., silicon oxide.

The contact plug 580 may be formed by forming a third photoresist pattern (not shown) on the insulating interlayer 570, etching the insulating interlayer 570 using the third photoresist pattern as an etching mask to form a contact hole, forming a conductive layer to fill the contact hole, and planarizing the conductive layer until an upper surface of the insulating interlayer 570 may be exposed.

The conductive layer may include a metal, e.g., tungsten, copper, aluminum, etc., and a metal nitride.

The third photoresist pattern may be formed by forming a third photoresist layer (not shown) on the insulating interlayer 570, and patterning the third photoresist layer using the second mask 110 including the layout of the contact plug 150.

The semiconductor device may be manufactured by the above processes.

Figure 15:
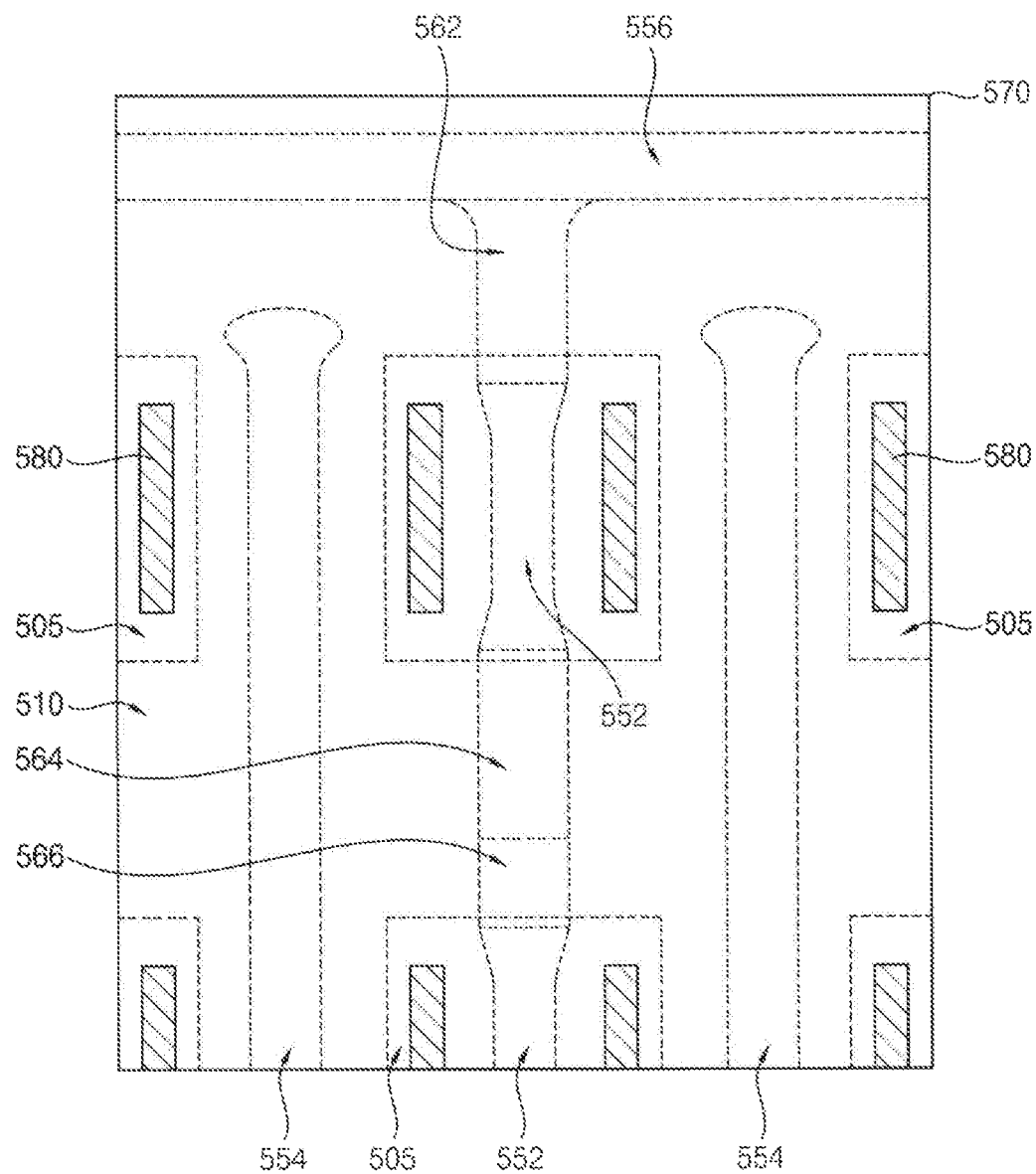
FIG. 15 is a plan view illustrating a semiconductor device in accordance with example embodiments.

FIG. 15 is a plan view illustrating a semiconductor device in accordance with example embodiments.

The semiconductor device may be manufactured using the fourth mask 310 designed illustrated with reference to FIGS. 7 to 9. That is, a photoresist pattern may be formed on a substrate or an etching object layer on the substrate using the fourth mask 310, and the substrate or the etching object layer may be patterned using the photoresist pattern as an etching mask to manufacture the semiconductor device.

This semiconductor device may be substantially the same as or similar to that manufactured by the method illustrated with reference to FIGS. 11 to 14, except for the gate structure and the gate tap. Thus, like reference numerals refer to like elements, and detailed descriptions thereon are omitted herein.

Referring to FIG. 15, the first gate structure 552 may extend in the first direction on the plurality of active regions 505 spaced apart from each other.

In example embodiments, a width in the second direction of a portion of the first gate structure 552 on an edge of the active region 505 in the first direction may be greater than a width in the second direction of a portion of the first gate structure 552 on a central portion of the active region 505 in the first direction. The portion of the first gate structure 552 on the edge of the active region 505 in the first direction and a portion of the first gate structure 552 extended in the first direction therefrom may be referred to as a gate tap.

In example embodiments, the first gate structure 552 may include the first and second gate taps 562 and 564 and a third gate tap 566. The first gate tap 562 may be a portion of the first gate structure 552 extending in the first direction on one edge of one of the active regions 505 and a portion of the isolation pattern 510 to contact a sidewall of the third gate structure 556, the second gate tap 564 may be a portion of the first gate structure 552 extending in the first direction on another edge of the one of the active regions 505 and a portion of the isolation pattern 510, and the third gate tap 566 may be a portion of the first gate structure 552 extending in the first direction on one edge of another one of the active regions 505 and a portion of the isolation pattern 510. In example embodiments, the second and third gate taps 564 and 566 may contact each other on the isolation pattern 510.

In the semiconductor device, the first gate tap 562 may be formed at an area close to the third gate structure 556, and the second gate tap 564 may be extended in the first direction to contact the third gate tap 566. Thus, the third gate structure 552 may have an increased width on the isolation pattern 510 so that the process margin during a patterning process may be increased.

While example embodiments have been particularly shown and described, it will be understood by one of ordinary skill in the art that variations in form and detail may be made therein without departing from the spirit and scope of the claims.

What is claimed is:

1. A method of designing a mask, the method comprising:
designing a first mask including an active region, a gate structure, and a gate tap, the gate tap partially overlapping both of the active region and the gate structure, the gate structure including a plurality of gate structures spaced apart from each other, the plurality of gate structures including a first gate structure extending in a first direction and a second gate structure extending in a second direction substantially perpendicular to the first direction, and the gate tap including a plurality of gate taps spaced apart from each other;
changing the first mask by extending a portion of at least one gate tap of the plurality of gate taps at an outside of the active region in the first direction so that an edge of the gate tap partially overlapping the first gate structure contacts a sidewall of the second gate structure; and
performing an OPC on the changed first mask to design a second mask.

2. The method of claim 1, wherein the active region includes first and second active regions spaced apart from each other in the first direction, the gate structure extends in the first direction through the first and second active regions, and wherein the plurality of gate taps includes a first gate tap partially overlapping the gate structure and the first active region and a second gate tap partially overlapping the gate structure and the second active region.

3. The method of claim 2, wherein the extending the portion of the at least one gate tap includes extending a portion of the first gate tap so that an edge of the first gate tap contacts an edge of the second gate tap.

4. The method of claim 1, wherein the at least one gate tap has a width greater than that of the gate structure in a second direction substantially perpendicular to the first direction.

5. A method of designing a mask, the method comprising:

designing a mask including an active region, gate structures including a first gate structure extending in a first direction and a second gate structure extending in a second direction substantially perpendicular to the first direction, and gate taps including at least one gate tap partially overlapping both of the active region and one of the gate structures;

changing the mask by extending a portion of the at least one gate tap at an outside of the active region toward another one of the gate structures or another one of the gate taps until an edge of the least one gate tap partially overlapping the first gate structure contacts a sidewall of the second gate structure; and performing an OPC on the changed mask.

6. The method of claim 5, wherein the active region includes first and second active regions spaced apart from each other in the first direction, each of the gate structures extends in the first direction through the first and second active regions, and wherein the gate taps include a first gate tap partially overlapping the one of the gate structures and the first active region and a second gate tap partially overlapping the another one of the gate structures and the second active region.

7. The method of claim 6, wherein extending the portion of the at least one gate tap includes extending a portion of the first gate tap so that an edge of the first gate tap contacts an edge of the second gate tap.

8. The method of claim 5, wherein the at least one gate tap has a width greater than that of the one of the gate structures in a second direction substantially perpendicular to the first direction.

\* \* \* \* \*